United States Patent
Kimura et al.

(10) Patent No.: US 7,359,255 B2
(45) Date of Patent: Apr. 15, 2008

(54) SEMICONDUCTOR DEVICE HAVING AUTO TRIMMING FUNCTION FOR AUTOMATICALLY ADJUSTING VOLTAGE

(75) Inventors: Tohru Kimura, Yokohama (JP); Masahiro Yoshihara, Yokohama (JP); Masaru Koyanagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 11/438,345

(22) Filed: May 23, 2006

(65) Prior Publication Data
US 2006/0279442 A1 Dec. 14, 2006

(30) Foreign Application Priority Data
May 24, 2005 (JP) .............................. 2005-151022

(51) Int. Cl.
*G11C 7/00* (2006.01)
(52) U.S. Cl. .............................. 365/189.09; 365/189.11
(58) Field of Classification Search .......... 365/189.09, 365/189.11, 225.7; 327/541, 103

See application file for complete search history.

(56) References Cited

U.S. PATENT DOCUMENTS

| 6,661,715 B2 * | 12/2003 | Ishikawa et al. ....... 365/189.12 |
| 6,720,800 B2 | 4/2004 | Shyr et al. |
| 6,781,893 B2 * | 8/2004 | Hiraki et al. ............... 365/194 |
| 2005/0024129 A1 | 2/2005 | Jang |

FOREIGN PATENT DOCUMENTS

| JP | 2639328 | 4/1997 |
| JP | 2001-229697 | 8/2001 |
| KR | 1999-0083102 | 11/1999 |
| KR | 10-2005-0013771 | 2/2005 |

* cited by examiner

*Primary Examiner*—Vu A. Le
(74) *Attorney, Agent, or Firm*—Oblon, Spivak, McClelland, Maier & Neustadt, P.C.

(57) ABSTRACT

A reference voltage generation circuit generates a reference voltage. An internal voltage generation circuit generates an internal voltage on the basis of the reference voltage generated by the reference voltage generation circuit. A first trimming circuit trims the internal voltage. During trimming of the internal voltage, the first trimming circuit trims an externally supplied first target voltage in accordance with first trimming data. The first trimming circuit ends the trimming when the first target voltage meets a given condition for the reference voltage.

20 Claims, 11 Drawing Sheets

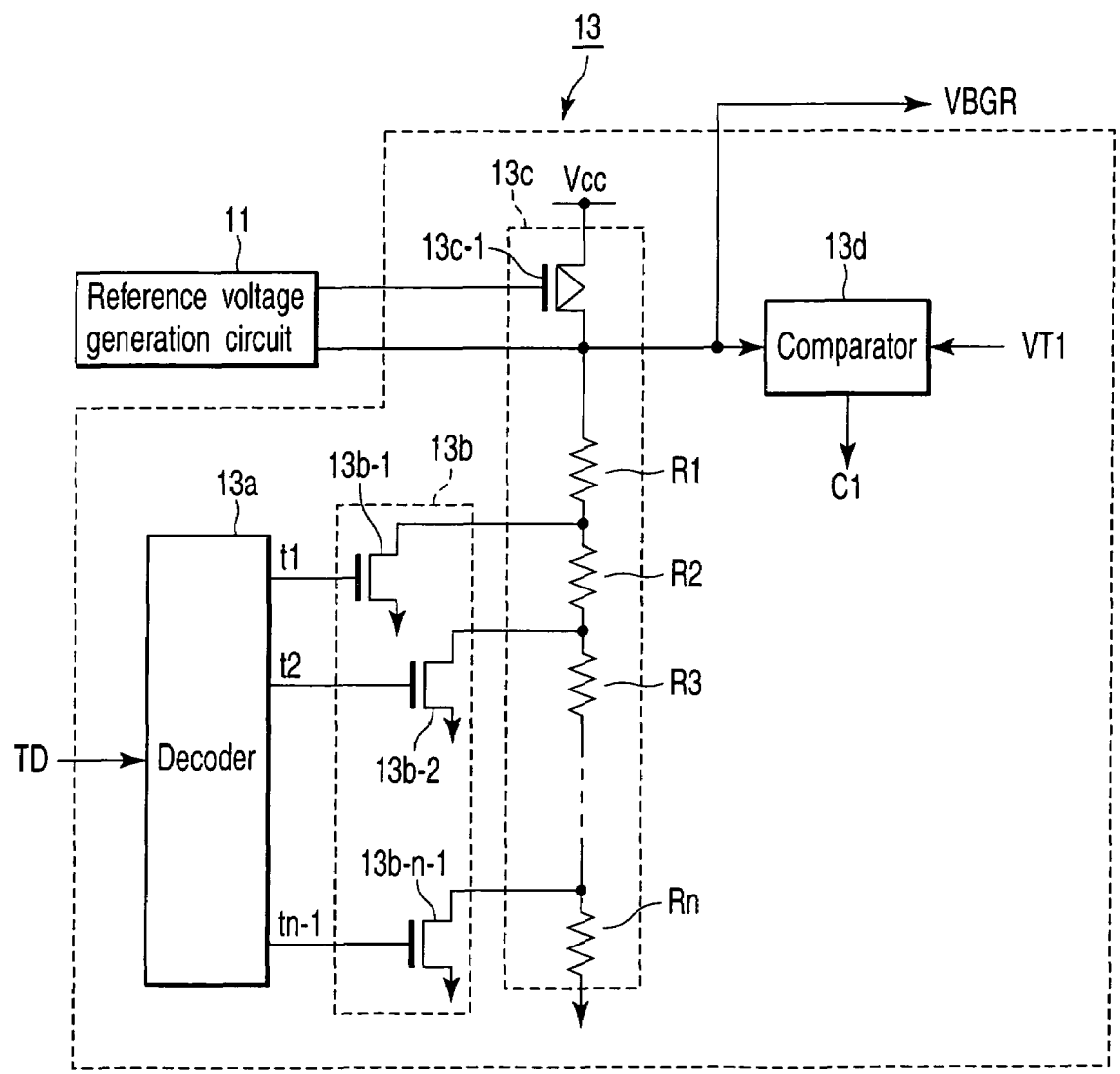
F I G. 2

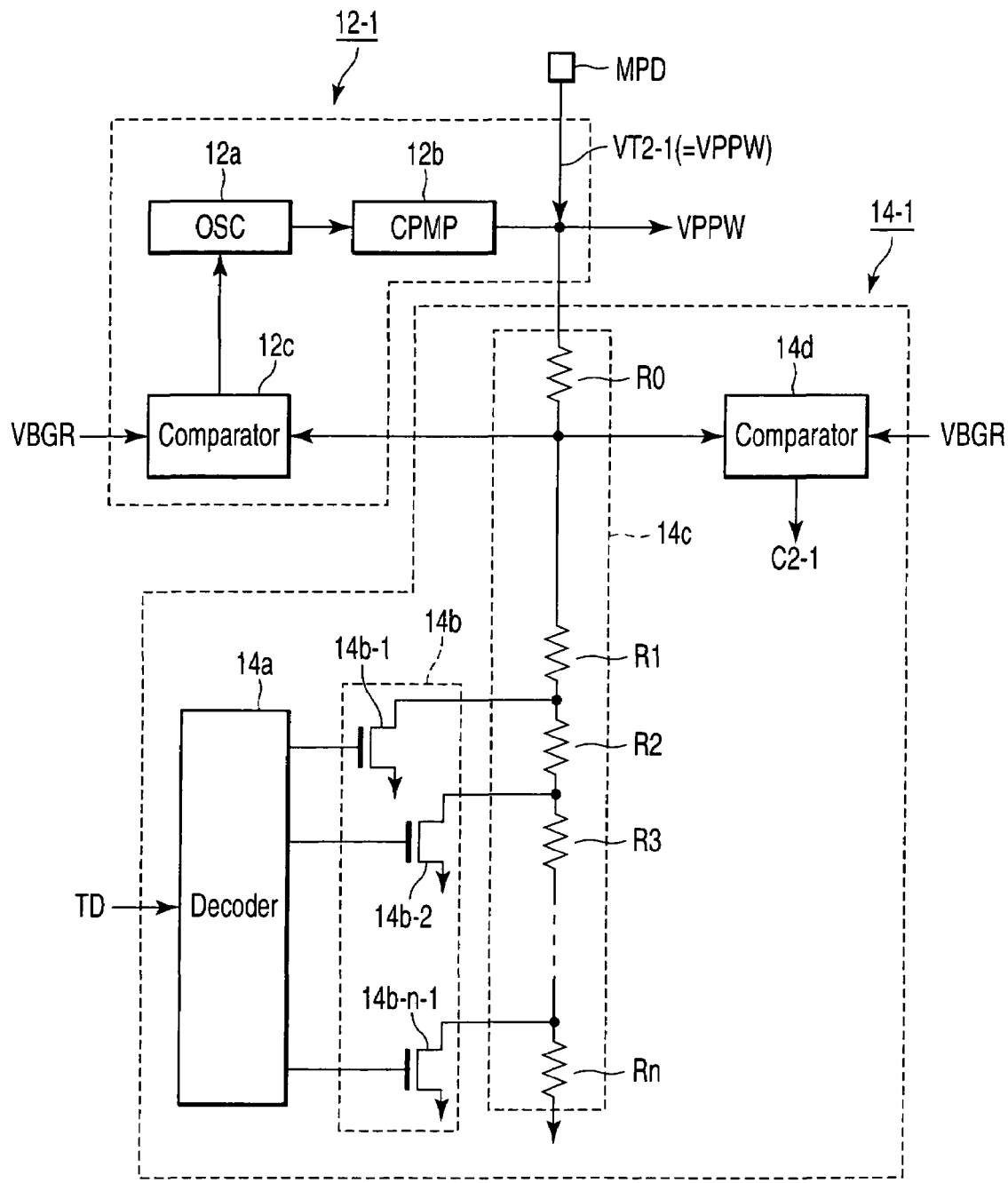
F I G. 3

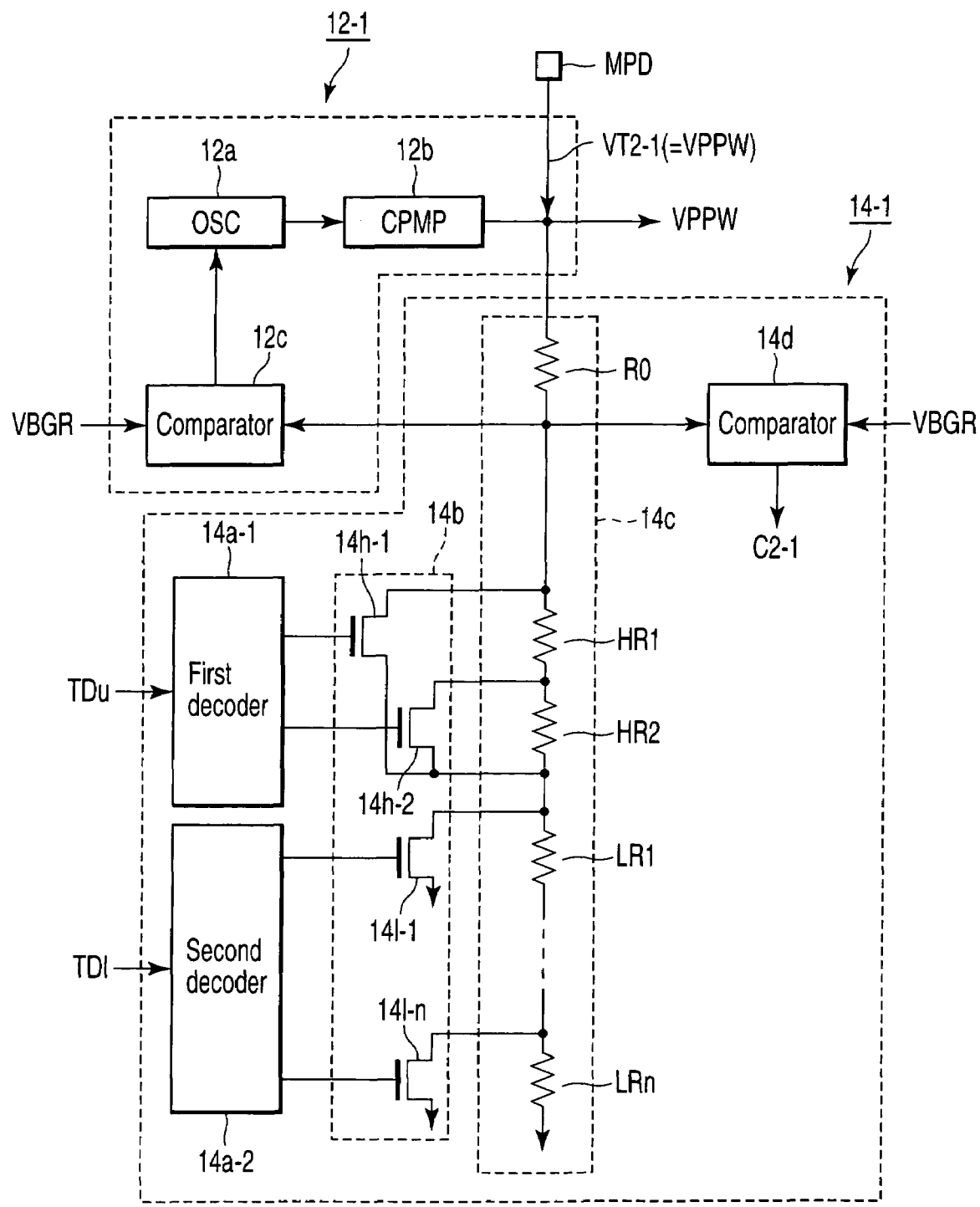
F I G. 9

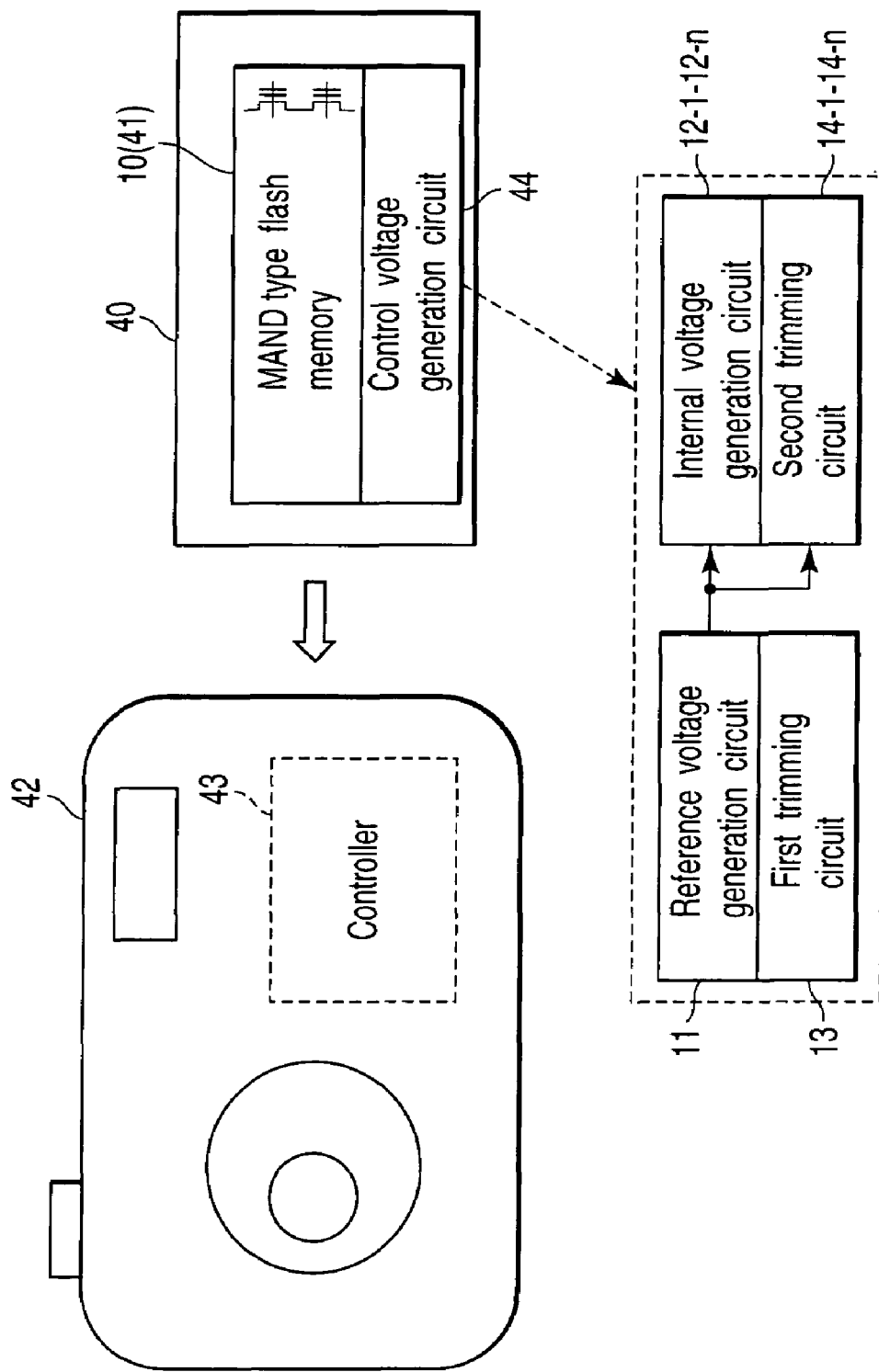
F I G. 11

SEMICONDUCTOR DEVICE HAVING AUTO TRIMMING FUNCTION FOR AUTOMATICALLY ADJUSTING VOLTAGE

CROSS-REFERENCE TO RELATED APPLICATIONS

This application is based upon and claims the benefit of priority from prior Japanese Patent Application No. 2005-151022, filed May 24, 2005, the entire contents of which are incorporated herein by reference.

BACKGROUND OF THE INVENTION

1. Field of the Invention

The present invention relates to a semiconductor device, for example, a NAND type flash memory, and in particular, to an auto trimming function for automatically adjusting a voltage generated inside the semiconductor device.

2. Description of the Related Art

A continuous reduction in the size of semiconductors has made the reliability of transistors more and more important. To improve the reliability of transistors, it is necessary to minimize voltages applied to the transistors. On the other hand, increasing the operation speeds of the transistors requires as high voltages as possible to be applied to them. In particular, the internal voltage of the semiconductor device is often set higher than a power voltage Vcc in order meet the need for fast operations. Thus, techniques for maintaining the reliability of the transistors are essential.

A variation in internal voltage is a factor preventing the achievement of both increased operation speed and improved reliability. An internal voltage generation circuit is commonly an analog circuit. Thus, the characteristics of the circuit vary sensitively with process parameters such as the threshold voltage Vth, wiring resistance Rs, and oxidized film thickness. Moreover, an internal voltage generation circuit has current mirror circuits. The characteristics of the circuit thus vary depending on the fine pattern shape of the current mirror circuit. The variation in internal voltage tends to be accelerated by the recent reduction in the size and power voltage Vcc of the semiconductor device.

A trimming function is a method for reducing a variation in internal voltage. The trimming function sets an internal voltage at a target value by, for example, finely adjusting the resistance value of a voltage dividing resistor provided at an output stage of the internal voltage generation circuit. In recent years, auto trimming has been proposed which compares an internal voltage generated inside a semiconductor device with an externally supplied target voltage to trim the internal voltage in a self-aligning manner on the basis of the comparison (see, for example, Jpn. Pat. Appln. KOKAI Publication No. 2001-229697).

This auto trimming is generally executed during a die sort test. Trimming data resulting from the auto trimming is stored in a register or an electric fuse. In other words, if after the auto trimming, evaluations are continued without turning off a power supply voltage, the trimming data is stored in the register circuit. If the trimming data is permanently used in products or the like, it is stored in the electric fuse.

For example, NAND type flash memories require high internal voltages to write, verify, or erase data. In particular, if after a write verify operation, a rewrite operation is performed by gradually raising a write voltage or if a plurality of data are stored in one memory cell as in a multivalue memory, then the threshold voltage of each memory cell needs to be precisely controlled. This also requires the internal voltage to be precisely controlled. Further, for example, dynamic RAMs require an accurate internal voltage in order to achieve both increased operation speed and improved reliability as described above. Therefore, generation of an accurate internal voltage have been desired.

BRIEF SUMMARY OF THE INVENTION

According to a first aspect of the invention, there is provided a semiconductor device comprising: a reference voltage generation circuit which generates a reference voltage; an internal voltage generation circuit which generates an internal voltage on the basis of the reference voltage generated by the reference voltage generation circuit; and a first trimming circuit which trims the internal voltage, the first trimming circuit, during trimming of the internal voltage, trimming an externally supplied first target voltage in accordance with first trimming data, and ending the trimming when the first target voltage meets a given condition for the reference voltage.

According to a second aspect of the invention, there is provided a semiconductor device comprising: a reference voltage generation circuit which generates a reference voltage; a first trimming circuit which trims the reference voltage generated by the reference voltage generation circuit, the first trimming circuit, during trimming of the reference voltage, ending the trimming when the reference voltage meets a given condition for an externally supplied first target voltage on the basis of first trimming data; an internal voltage generation circuit which generates an internal voltage on the basis of the reference voltage trimmed by the first trimming circuit; and a second trimming circuit which trims the internal voltage, the first trimming circuit, during trimming of the internal voltage, ending the trimming when an externally supplied second target voltage meets a given condition for the reference voltage on the basis of second trimming data.

According to a third aspect of the invention, there is provided a memory system comprising: a memory cell array in which a plurality of nonvolatile memory cells are arranged; and a control voltage generation circuit connected to the memory cell array, the control voltage generation circuit comprising: a reference voltage generation circuit which generates a reference voltage; an internal voltage generation circuit which generates an internal voltage on the basis of the reference voltage generated by the reference voltage generation circuit; and a first trimming circuit which trims the internal voltage, the first trimming circuit, during trimming of the internal voltage, trimming an externally supplied first target voltage in accordance with first trimming data, and ending the trimming when the first target voltage meets a given condition for the reference voltage.

BRIEF DESCRIPTION OF THE SEVERAL VIEWS OF THE DRAWING

FIG. 2 is a circuit diagram showing an example of a first trimming circuit in FIG. 1;

FIG. 3 is a circuit diagram showing an example of a second trimming circuit shown in FIG. 1;

FIG. 9 is a circuit diagram showing a second embodiment that is a variation of the second trimming circuit;

FIG. 11 is a diagram schematically showing the configuration of a memory system using a NAND type flash memory.

DETAILED DESCRIPTION OF THE INVENTION

Embodiments of the present invention will be described below with reference to the drawings.

First Embodiment

Figure 1:
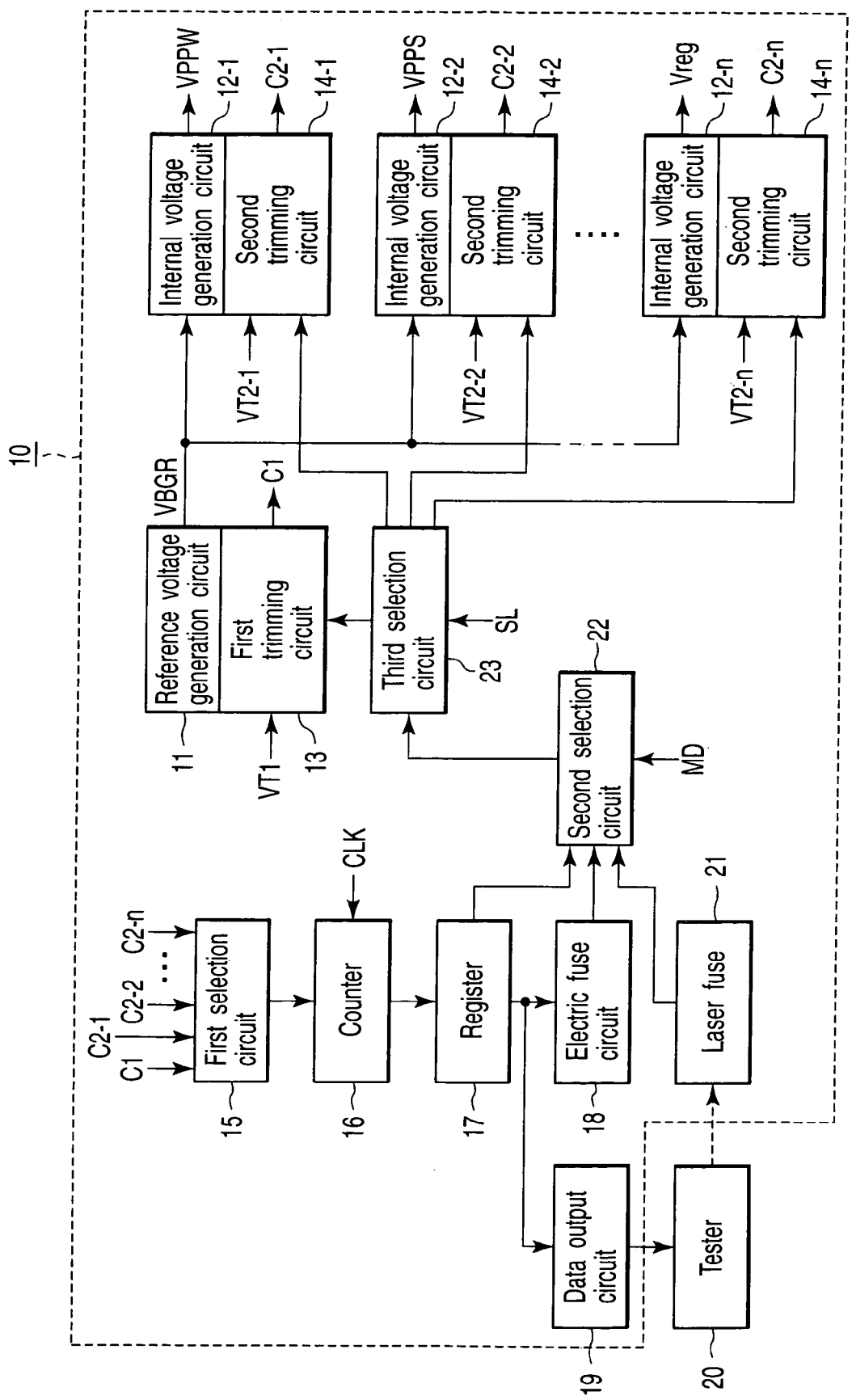
FIG. 1 is a diagram showing the configuration of a semiconductor device in accordance with a first embodiment.

In FIG. 1, a semiconductor device 10 has a reference voltage generation circuit 11 and internal voltage generation circuits 12-1, 12-2, 12-3, . . . 12-$n$. The reference voltage generation circuit 11 is composed of, for example, a well-known band gap reference (BGR) circuit to generate a reference voltage VBGR, which is supplied to the internal voltage reference circuits 12-1, 12-2, 12-3, . . . 12-$n$. The internal voltage generation circuits 12-1, 12-2, 12-3, . . . 12-$n$ generates internal voltages VPPW, VPPS, . . . , Vreg, respectively. The reference voltage generation circuit 11 is connected to a first trimming circuit 13. The internal voltage generation circuits 12-1, 12-2, 12-3, . . . , 12-$n$ are connected a plurality of second trimming circuits 14-1, 14-2, . . . , 14-$n$, respectively. The first trimming circuit 13 operates to trim the reference voltage as described later. The plurality of second trimming circuits 14-1, 14-2, . . . , 14-$n$ sequentially selectively operate to trim the internal voltage.

The first trimming circuit 13 trims resistance required to generate a reference voltage VBGR on the basis of a first target voltage VT1. The first trimming circuit 13 outputs a control signal C1 indicating the end of trimming if the first target voltage VT1 and the reference voltage VBGR meet a given condition. The given condition is that for example, the reference voltage VBGR is higher or lower than the first target voltage VT1 but may be that there is a minimum difference between the reference voltage VBGR and the first target voltage VT1. The second trimming circuits 14-1, 14-2, . . . , 14-$n$ output control signals C2-1, C2-2, . . . , C2-$n$, respectively, indicating the end of trimming if the corresponding second target voltage VT2-1, VT2-2, . . . , VT2-$n$ and the reference voltage VBGR meet a given condition as described above.

A first selection circuit 15 is supplied with the control signals C1, C2-1, C2-2, . . . , C2-$n$, output by the first trimming circuit 13 and plurality of second trimming circuits 14-1, 14-2, . . . , 14-$n$. The first selection circuit 15 selects one of the control signals C1, C2-1, C2-2, . . . , C2-$n$. The selected control signal is supplied to a counter 16.

The counter 16 counts clock signals CLK during trimming of the reference voltage and the internal voltage. The counter 16 ends the count operation in response to one of the control signals C1, C2-1, C2-2, . . . , C2-$n$ supplied by the first selection circuit 15. A count value in the counter 16 is held in a register 17 as trimming data. The trimming data held in the register 17 is supplied to an electric fuse circuit 18.

The electric fuse circuit 18 is composed of, for example, a plurality of anti-fuses. The anti-fuses are fuse elements that apply an overvoltage to destroy an insulating film to store data. The electric fuse circuit 18 has a capacity sufficient to store the trimming data corresponding to the count value obtained by the counter 16 in response to the control signal C1, C2-1, C2-2, . . . , C2-$n$, the trimming data being held in the register 17.

After being stored in the electric fuse circuit 18, the trimming data held in the register 17 is supplied, via a data output circuit 19, to a tester 20 connected to the semiconductor device 10. The tester 20 stores the trimming data.

The trimming operation is performed, for example, during a die sort test. After the die sort test and before a redundancy circuit is set, the trimming data stored in the tester 20 is stored in a laser fuse circuit 21 provided in the semiconductor device 10. The laser fuse circuit 21 is composed of a plurality of laser fuse elements having a storage capacity comparable to that of, for example, the electric fuse circuit 18. The laser fuse elements is blown in accordance with trimming data for setting a reference voltage and for setting a plurality of internal voltages. These trimming data are thus stored in a laser fuse circuit 21.

On the other hand, a second selection circuit 22 in the semiconductor device 10 selects one of the trimming data output by the register 17, electric fuse circuit 18, and laser fuse circuit 21 in accordance with a mode signal MD. Specifically, if the mode signal indicates a trimming operation for the reference voltage, the second selection circuit 22 selects an output signal from the register 17. If the mode signal MD indicates a trimming operation for the internal voltage, the second selection circuit 22 appropriately selects an output signal from the register 17 or the electric fuse circuit 18. If the mode signal MD indicates a normal operation of the semiconductor device, the second selection circuit selects an output signal from the laser fuse circuit 21. The trimming data selected by the second selection circuit 22 is supplied to a third selection circuit 23. The third selection circuit 23 selects one of the first trimming circuit 13 and the plurality of second trimming circuits 14-1, 14-2, . . . , 14-$n$ in accordance with a selection signal SL. The third selection circuit 23 then supplies the selected trimming circuit with the trimming data supplied by the second selection circuit 22. Each trimming circuit trims the reference or internal voltage in accordance with the trimming data supplied via the third selection circuit 23.

The configuration shown in FIG. 1 shows that both reference voltage VBGR and plurality of internal voltages VPPW, VPPS, . . . , Vreg are trimmed. This configuration is preferable as described later but the present invention is not limited to it. For example, it is possible to trim only the reference voltage VBGR, while avoiding trimming the internal voltages VPPW, VPPS, . . . , Vreg. In this case, the plurality of second trimming circuits 14-1 to 14-$n$, first selection circuit 15, and third selection circuit 23 can be omitted.

Alternatively, it is of course possible to trim the internal voltages VPPW, VPPS, . . . , Vreg, while avoiding trimming the reference voltage VBGR. Alternatively, the reference voltage VBGR and the plurality of internal voltages VPPW, VPPS, . . . , Vreg can be arbitrarily trimmed without any change in circuit configuration by, for example, using a test mode in which the operations of a plurality of circuits in the chip can be selectively changed in accordance with an input signal from outside the chip, to select a voltage to be trimmed.

Moreover, the data output circuit 19 and the laser fuse 21 are not necessarily required but may be omitted. In this case, trimming data set during trimming of the reference or internal voltage is stored in the electric fuse circuit 18. During a normal operation, the second selection circuit 22 selects the trimming data stored in the electric fuse 18.

FIG. 2 shows an example of the first trimming circuit 13, which is composed of a decoder 13a, a switch circuit 13b, a voltage division circuit 13c, and a comparator 13d. The decoder 13a decodes supplied trimming data TD to output a plurality of signals. The switch circuit 13b has, for example, a plurality of N channel MOS transistors 13b-1, 13b-2, . . . , 13b-n-1. Each of gates of the transistors 13b-1, 13b-2, 13b-n-1 are connected to an output end of the decoder 13a.

The voltage division circuit 13c is composed of, for example, a P channel MOS transistor 13c-1 connected in series between the power source and the ground, and a plurality of resistors R1, R2, R3, . . . , Rn. The resistors R1, R2, R3, . . . , Rn have, for example, an equal resistance value. A voltage output by the reference voltage generation circuit 11 is supplied to the gate of the transistor 13c-1 and the connection node between the transistor 13c-1 and the resistor R1. One end of the transistor 13b-1 is connected to the connection node between the resistors R1 and R2, with the other end grounded. One end of the transistor 13b-2 is connected to the connection node between the resistors R2 and R3, with the other end grounded. One end of the transistor 13b-n-1 is connected to the connection node between the resistors Rn-1 (not shown) and Rn, with the other end grounded. The switch circuit 13b selects one of the plurality of resistors R1 to Rn, constituting the voltage division circuit 13c, in accordance with an output signal from the decoder 13a. The switch circuit 13b thus trims an output voltage from the reference voltage generation circuit 11, that is, the reference voltage VBGR.

The reference voltage VBGR trimmed by the voltage division circuit 13c is supplied to one input end of the comparator 13d. The other input end of the comparator 13d is supplied with a first target voltage VT1 provided by, for example, an external source. During trimming, the comparator 13d compares the reference voltage VBGR with the first target voltage VT1. When the reference voltage is, for example, at least the first target voltage VT1 (for example, 1 V), the comparator 13d outputs a control signal C1.

FIG. 3 shows an example of the internal voltage generation circuit 12-1 and the second trimming circuit 14-1. The other internal voltage generation circuits 12-2 to 12-n and the second trimming circuits 14-2 to 14-n have configurations similar to those in FIG. 3. However, the other internal voltage generation circuits 12-2 to 12-n and the second trimming circuits 14-2 to 14-n generate internal voltages different from those generated by the internal voltage generation circuit 12-1 and the second trimming circuit 14-1, respectively.

In FIG. 3, the internal voltage generation circuit 12-1 is composed of an oscillator (OSC) 12a, a charge pump circuit (CPMP) 12b, and a comparator 12c. The oscillator 12a oscillates, for example, a signal of a given period, which is supplied to the charge pump circuit 12b. The charge pump circuit 12b boosts the power supply voltage in accordance with the supplied signal. An output from the charge pump circuit 12b is divided by the voltage division circuit 14c, described later. The divided voltage is supplied to one input end of the comparator 12c. The other input end of the comparator 12c is supplied with the reference voltage VBGR, generated by the reference voltage generation circuit 11. The comparator 12c compares the reference voltage VBGR with the divided voltage. If the divided voltage is equal to or lower than the reference voltage, the comparator 12c operates the oscillator 12a. If the divided voltage is higher than the reference voltage, the comparator 12c stops the oscillator 12a.

The second trimming circuit 14-1 is composed of a decoder 14a, a switch circuit 14b, a voltage division circuit 14c, and a comparator 14d. The decoder 14a decodes set trimming data TD to output a plurality of signals. The switch signal 14b has, for example, a plurality of N channel MOS transistors 14b-1, 14b-2, . . . , 14b-n-1. The gates of the transistors 14b-1, 14b-2, . . . , 14b-n-1 are each connected to an output end of the decoder 14a.

The voltage division circuit 14c is composed of a plurality of resistors R0, R1, R2, R3, . . . , Rn connected in series together between a monitor pad MPD and the ground. One input end of the comparator 12c is connected to the connection node between the resistors R0 and R1. One end of the transistor 14b-1 is connected to the connection node between the resistors R1 and R2, with the other end grounded. One end of the transistor 14b-2 is connected to the connection node between the resistors R2 and R3, with the other end grounded. One end of the transistor 14b-n-1 is connected to the connection node between the resistors Rn-1 (not shown) and Rn, with the other end grounded. The switch circuit 14b selects one of the plurality of resistors R1 to Rn, constituting the voltage division circuit 14c, in accordance with an output signal from the decoder 14a. The switch circuit 14b thus trims the output voltage from the internal voltage generation circuit 12-1, that is, the internal voltage VPPW.

The internal voltage VPPW trimmed by the voltage division circuit 14c is supplied to one input end of the comparator 14d. The other input end of the comparator 14d is supplied with the reference voltage VBGR. The comparator 14d has the same configuration as that of the comparator 12c, constituting the internal voltage generation circuit 12-1. This reduces a setting error associated with trimming.

For example, the monitor pad MPD connects to the connection node between an output end of the internal voltage generation circuit 12-1 and the voltage division circuit 14c. During trimming of the internal voltage, the monitor pad MPD is supplied with the second target voltage VT2-1. The comparator 14d compares the reference voltage VBGR with the second target voltage VT2-1, provided by the voltage division circuit 14c. When for example, the second target voltage VT2-1 is equal to or higher than the reference voltage VBGR, the comparator 14d outputs the control signal C2-1.

Figure 4A:
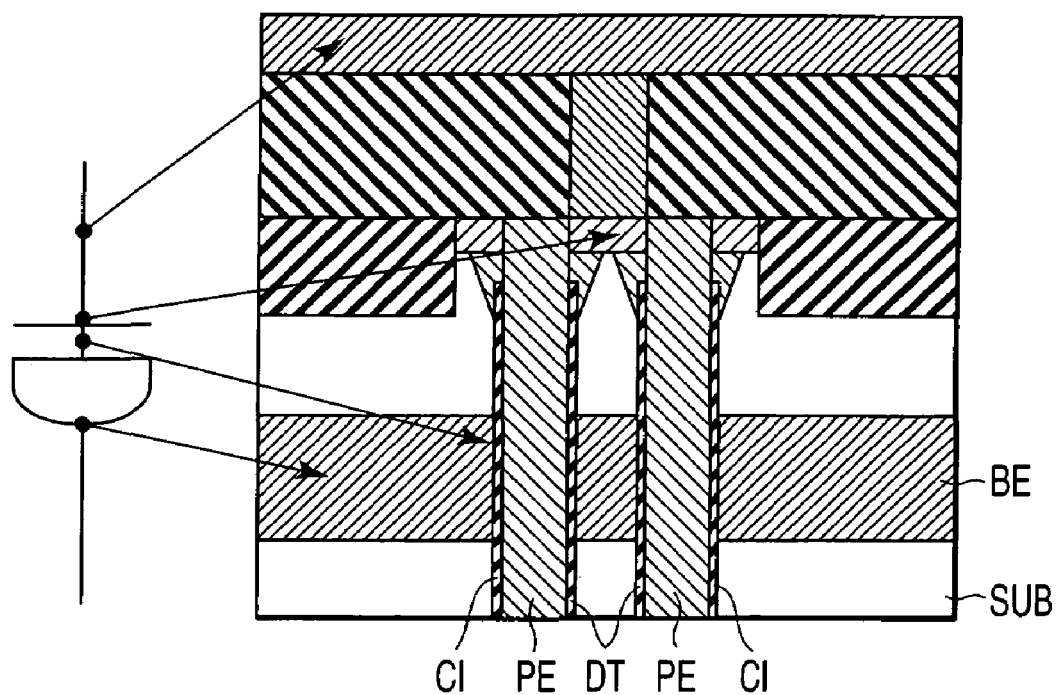
FIG. 4A is a sectional view showing an example of an electric fuse element and FIG. 4B is a diagram showing another example of an electric fuse element.
Figure 4B:
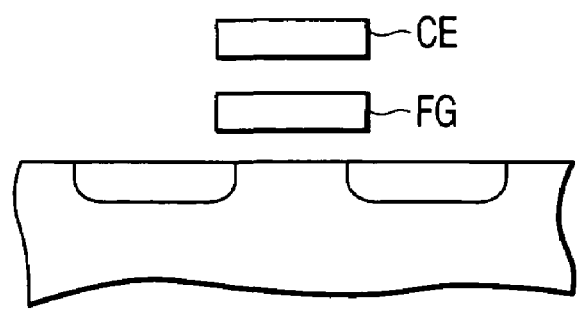

FIGS. 4A and 4B show an example of the electric fuse element constituting the electric fuse circuit 18. FIG. 4A shows an example of anti-fuse using a trench capacitor. FIG. 4B shows an example of a fuse using an EEPROM cell.

In FIG. 4A, a trench DT is formed inside a substrate SUB. A capacitor insulating film CI is formed on an inner wall of the trench DT. A buried electrode BE is formed in the trench DT. A plate electrode PE is formed in the substrate SUB. Data is stored in the trench DT by applying a voltage to the plate electrode PE and buried electrode BE to destroy the capacitor insulating film CI.

In FIG. 4B, the EEPROM cell is a stacked gate type transistor having a floating gate FG and a control gate CG.

Data is stored in the EEPROM cell by applying a high voltage to the control gate CG to inject electrons into the floating gate FG.

Figure 5:
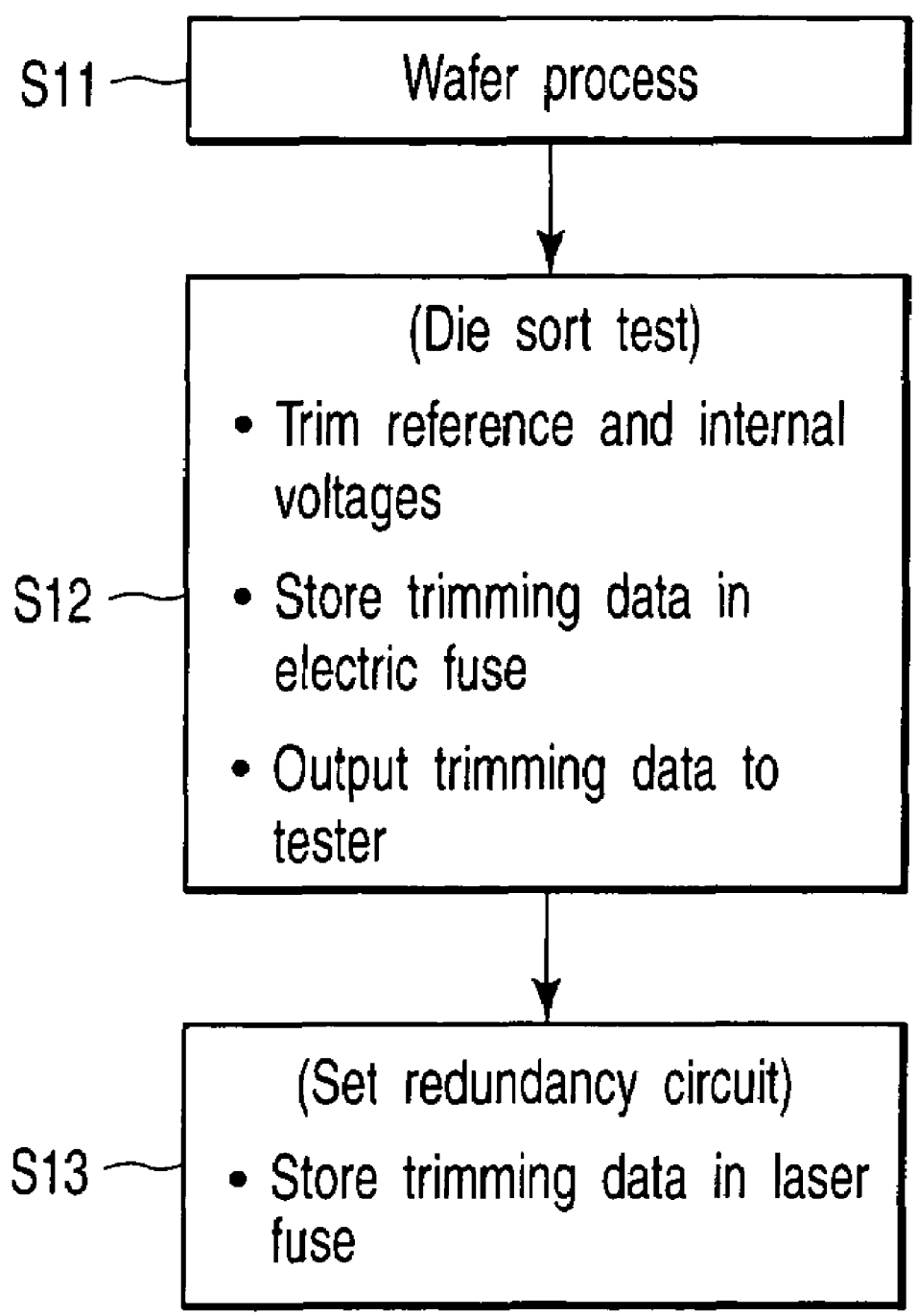
FIG. 5 is a flowchart schematically showing a process for testing a semiconductor device.

FIG. 5 schematically shows a step of testing the semiconductor device. Once a wafer process S11 is finished, a die sort test is executed on the wafer. During the die sort test, the reference voltage VBGR and the internal voltages VPPW, VPPS, . . . , Vreg are trimmed. Trimming data resulting from the trimming is stored in the electric fuse element and also output to the external tester for storage. Then, in a redundancy circuit setting step (S13), the trimming data stored in the tester is stored in the laser fuse element.

Figure 6:
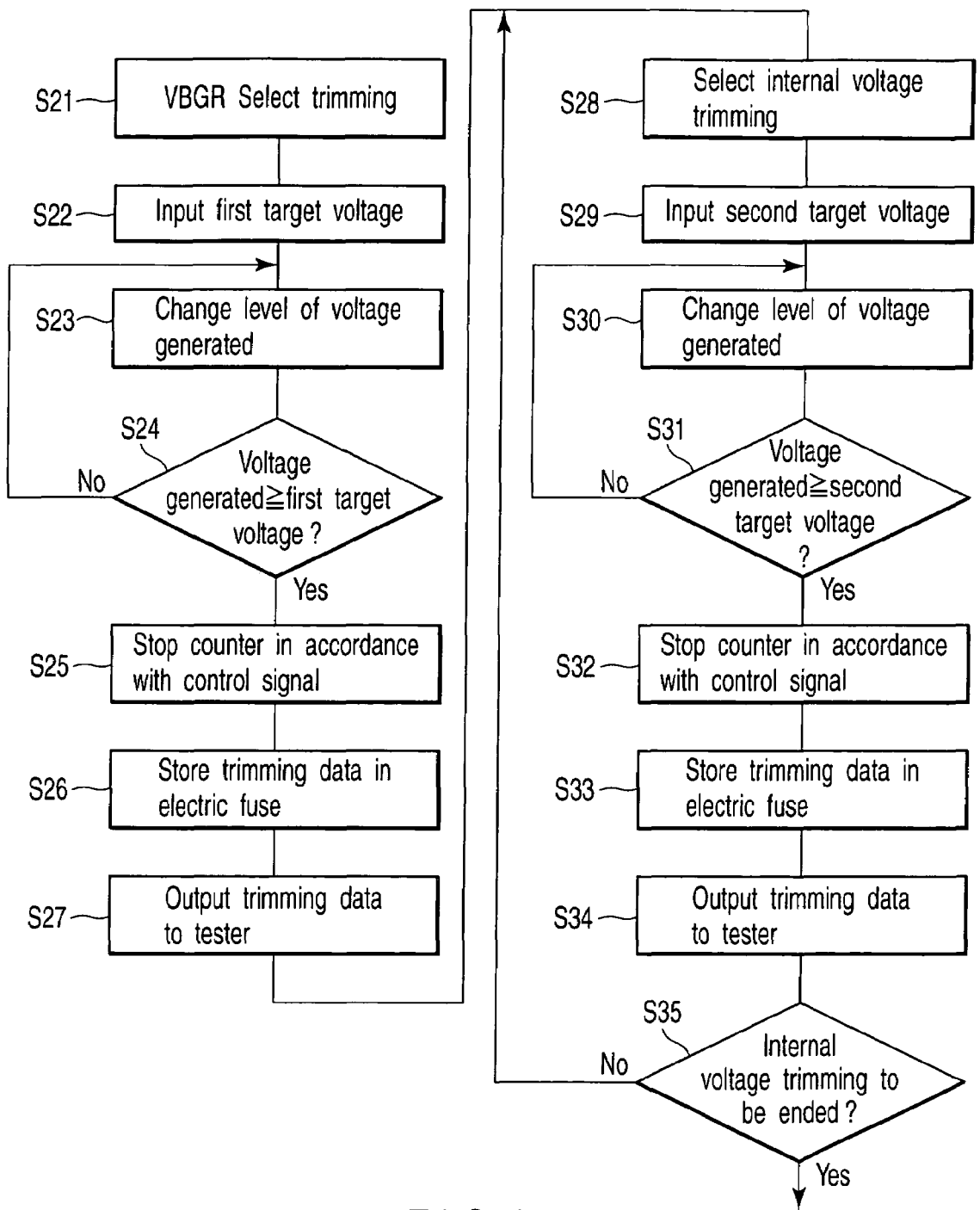
FIG. 6 is a flowchart schematically showing a trimming operation during a die sort test.

FIG. 6 schematically shows a trimming operation during a die sort test. The operations shown in FIGS. 1 to 3 will be described with reference to FIG. 6. First, trimming of the reference voltage VBGR is selected (S21). Then, as shown in FIGS. 1 and 2, the first target voltage VT1 is externally supplied to the first trimming circuit 13 (S22). The first selection circuit 15 selects an output signal from the first trimming circuit 13. The second selection circuit 22 selects an output signal from the register 17 in accordance with the mode signal MD indicating the reference voltage trimming mode. The third selection circuit 23 selects the first trimming circuit 13 in accordance with a selection signal SL.

The level of the voltage output by the reference voltage generation circuit is subsequently changed (S23). The comparator 13d compares the reference voltage VBGR, output by the voltage division circuit 13c, with the first target voltage VT1. In the meantime, the counter 16, shown in FIG. 1, counts the clock signal CLK. An output signal from the counter 16 is held in the register 17. An output signal from the register 17 is supplied to the first trimming circuit 13 via the second and third selection circuits 22 and 23. In the first trimming circuit 13, the decoder 13a, shown in FIG. 2, decodes the signal supplied by the register 17. An output signal from the decoder 13a is supplied to the transistors 13b-1 to 13b-n-1 in the switch circuit 13b. The transistors 13b-1 to 13b-n-1 are sequentially turned on in accordance with an output signal from the decoder 13a; the transistor 13b-1 and then the transistor 13b-2 are turned on. Thus, the number of resistors connected to the resistor R1 in the voltage division circuit 13c sequentially increases; the resistors R2 to Rn are sequentially connected to the resistor R1 in this order. Consequently, the output voltage from the voltage division circuit 13c, that is, the reference voltage VBGR, gradually increases. The comparator 13d, shown in FIG. 2, compares the reference voltage VBGR with the first target voltage VT1. If for example, the reference voltage VBGR is equal to or higher than the first target voltage VT1, the comparator 13d outputs the control signal C1.

Figure 7:
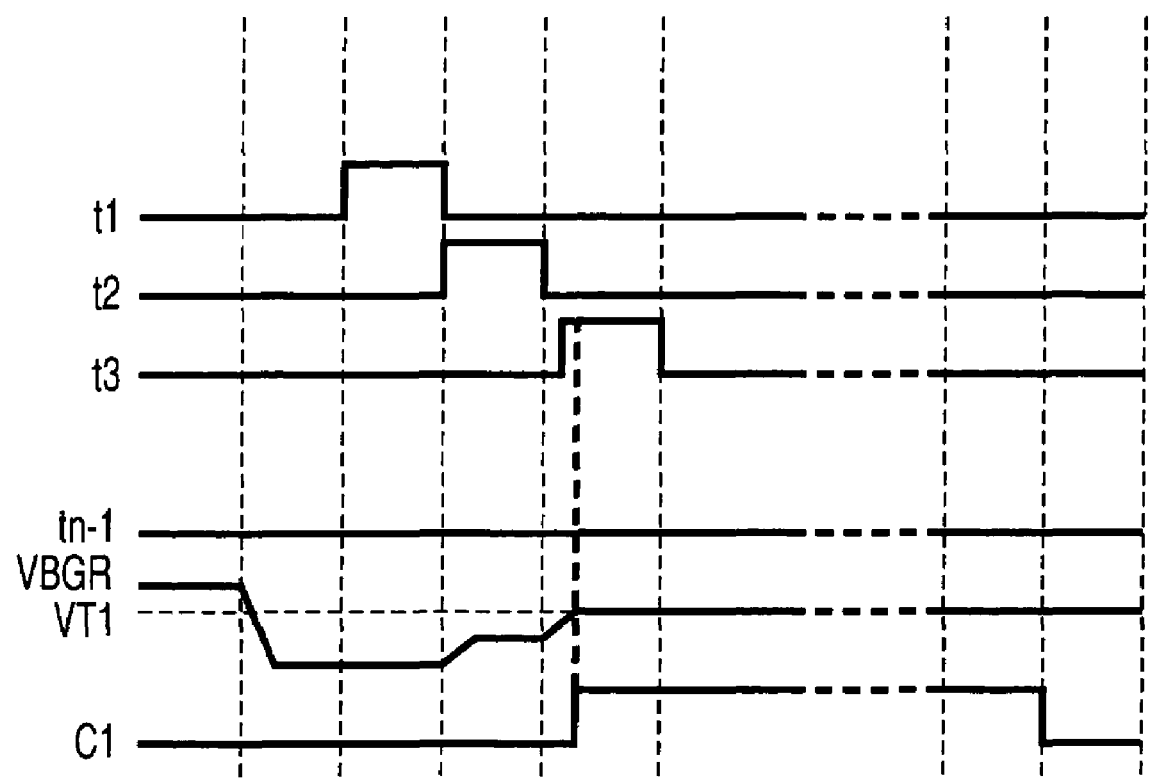
FIG. 7 is a timing chart showing output signals from a decoder and operations of a comparator.

FIG. 7 shows an output signal from the decoder 13a and an operation of the comparator 13d. An initial value of the reference voltage VBGR is determined by a ratio initialized by the voltage division circuit 13c. The initial value deviates from an expected set value for the previously described reason, as shown in FIG. 7. Then, the start of trimming sets the resistance ratio in the voltage division circuit 13c at the minimum value within the trimming range. The voltage driving circuit 13c outputs the reference voltage VBGR. Subsequently, in accordance with an output signal from the decoder 13a, the reference voltage VBGR increases consistently with the resistance value of the voltage division circuit 13c. If the reference voltage VBGR is equal to or higher than the first target voltage VT1, the comparator 13d outputs, for example, the control signal C1 indicating, for example, the end of trimming. The control signal C1 output by the comparator 13d is supplied to the counter 16 via the first selection circuit 15. The counter 16 is stropped in accordance with the control signal C1 (S24 and S25).

A count value from the counter 16 is held in the register 17 as trimming data. The trimming data held in the register 17 is supplied to the electric fuse circuit 18 for storage (S26). The trimming data held in the register 17 is supplied to the tester 20 outside the semiconductor device 10 via the data output circuit 19 shown in FIG. 1, for storage (S27).

Then, as shown in FIG. 6, trimming of the internal voltage is selected (S28). Then, the second target voltage VT2-1 (for example, 3.2 V) is supplied to the second trimming circuit 14-1 (S29). The second target voltage VT2-1 is the same as the internal voltage VPPW, generated by the internal voltage generation circuit 12-1. The second target voltage VT2-1 is externally supplied to the monitor pad MPD, shown in FIG. 3. In other words, during trimming of the internal voltage, the internal voltage generation circuit 12-1 is at a stop and is supplied with the second target voltage VT2-1, which is the same as the accurately controlled internal voltage VPPW.

During trimming of the internal voltage, the first selection circuit 15 selects an output signal from the second trimming circuit 14-1. The second selection circuit 22 selects an output signal from the register 17 in accordance with the mode signal MD indicating the trimming mode. The third selection circuit 23 selects the second trimming circuit 14-1 in accordance with the selection signal SL.

During a die sort test, the reference voltage generation circuit 11 generates a reference voltage VBGR in accordance with the trimming data resulting from the trimming of the reference voltage and stored in the electric fuse circuit 18. Thus, during trimming of the internal voltage, the second selection circuit 22 selects the electric fuse circuit 18 to supply the third selection circuit 23 with the trimming data stored in the electric fuse circuit 18. The third selection circuit 23 selects the first trimming circuit 13 in accordance with the selection signal SL. The third selection circuit 23 then supplies the trimming data to the decoder 13a in the first trimming circuit 13, shown in FIG. 2. Thus, the first trimming circuit 13 controls the switch circuit 13b in accordance with an output signal from the decoder 13a to set the resistance value for the voltage division circuit 13c.

Then, the level of the internally generated voltage is changed (S30). The comparator 14d, shown in FIG. 3, compares the reference voltage VBGR, supplied by the reference voltage generation circuit 11, with the second target voltage VT2-1, provided by the voltage division circuit 14c. In the meantime, the counter 16, shown in FIG. 1, counts the clock signal CLK. An output signal from the counter 16 is held in the register 17. An output signal from the register 17 is supplied to the second trimming circuit 14-1 via the second and third selection circuits 22 and 23. In the second trimming circuit 14-1, the decoder 14a, shown in FIG. 3, decodes the signal supplied by the register 17. An output signal from the decoder 14a is supplied to the transistors 14b-1 to 14b-n-1 in the switch circuit 14b. The transistors 14b-1 to 14b-n-1 are sequentially turned in accordance with the output signal from the decoder 14a; the transistor 14b-1 and then the transistor 14b-2 are turned on. Thus, the number of resistors connected to the resistor R1 in the voltage division circuit 14c sequentially increases; the resistors R2 to Rn are sequentially connected to the resistor R1 in this order. Consequently, the output voltage from the voltage division circuit 14c, that is, the internal voltage VPPW, gradually increases. The comparator 14d, shown in FIG. 3, compares the reference voltage VBGR with the second target voltage VT2-1, provided by the voltage division circuit 14c. If for example, the second target voltage VT2-1 is equal to or higher than the reference voltage VBGR (for example, 1 V), the comparator 14d outputs the control signal C2-1. The control signal C2-1 output by the comparator 14d is supplied to the counter 16 via the first selection circuit 15. The counter 16 is stopped in accordance with the control signal C2-1 (S31 and S32).

A count value from the counter 16 is held in the register 17 as trimming data. The trimming data held in the register 17 is supplied to the electric fuse circuit 18 for storage (S33). The trimming data held in the register 17 is supplied to the tester 20 outside the semiconductor device 10 via the data output circuit 19 shown in FIG. 1, for storage (S34).

Then, the device determines whether or not all the internal voltages have been trimmed (S35). If not all the internal voltages have been trimmed, the control shifts to step S28 to select trimming of the next internal voltage, for example, the internal voltage VPPS. Subsequently, the above operation is repeated to trim the internal voltage VPPS. All the internal voltages are thus trimmed.

As previously described, the test mode may be used to selectively trim the desired internal voltage.

During a die sort test, when trimming of the reference voltage VBGR and plurality of internal voltages VPPW, VPPS, . . . , Vreg is completed as described above, the trimming data corresponding to each voltage is stored in the tester 20, connected to the semiconductor device 10.

After the die sort test is finished, when a redundancy circuit is set, the trimming data stored in the tester 20 is stored in the laser fuse circuit 21 in the semiconductor device 10 as shown in FIG. 5 (S13). That is, the laser fuse element (not shown) in the laser fuse circuit 21 is blown in accordance with the trimming data, which is stored in the laser fuse element.

When the semiconductor device operates, the second selection circuit 22 selects the laser fuse circuit 21 to supply the first trimming circuit 13 and plurality of second trimming circuits 14-1 to 14-n with the trimming data for the reference voltage VBGR and each of the plurality of internal voltages VPPW, VPPS, . . . , Vreg, the trimming data being stored in the laser fuse circuit 21. The reference voltage generation circuit 11 and the plurality of internal voltage generation circuits 12-1 to 12-n generate a reference voltage VBGR and a plurality of internal voltages VPPW, VPPS, . . . , Vreg which have been trimmed to the optimum levels in accordance with the trimming data.

The first embodiment can trim the plurality of internal voltages VPPW, VPPA, . . . , Vreg. If the internal voltage deviates from a set value, the prior art cannot correct the deviation. Thus, the prior art cannot generate any proper internal voltage. However, the first embodiment connects the second trimming circuits 14-1 to 14-n to the internal voltage generation circuits 12-1 to 12-n, respectively, so that the second trimming circuits 14-1 to 14-n can trim the internal voltages VPPW, VPPA, . . . , Vreg. Consequently, the proper internal voltages VPPW, VPPA, . . . , Vreg can be generated.

The first embodiment can further trim the reference voltage VBGR to generate an accurate reference voltage VBGR. Thus, the plurality of internal voltage generation circuits 12-1 to 12-n, to which the reference voltage VBGR is supplied, can generate internal voltages VPPW, VPPA, . . . , Vreg with the variation among them minimized.

Further, to trim the internal voltages VPPW, VPPA, . . . , Vreg, the resistance value of the voltage division circuit 14c is trimmed using the externally supplied, accurately controlled second target voltages VT2-1 to VT2-n. This enables the internal voltage generation circuits 12-1 to 12-n to generate accurate internal voltages VPPW, VPPA, . . . , Vreg equal to the second target voltages VT2-1 to VT2-n, which serve as set values.

The first embodiment also causes the data output circuit 19 to output the trimming data to the external tester 20 and causes the trimming data stored in the tester 20 to be stored in the laser fuse 21. When the semiconductor device 10 operates, a reference voltage VBGR and a plurality of internal voltages VPPW, VPPS, . . . , Vreg are generated at the optimum levels on the basis of the trimming data stored in the laser fuse circuit 21. The trimming data is accordingly stored in the laser fuse circuit 21, which is more reliable than electric fuses, and can thus stored more reliably than in the prior art. This enables the reliability of the semiconductor to be maintained for a long time.

Figure 8A:
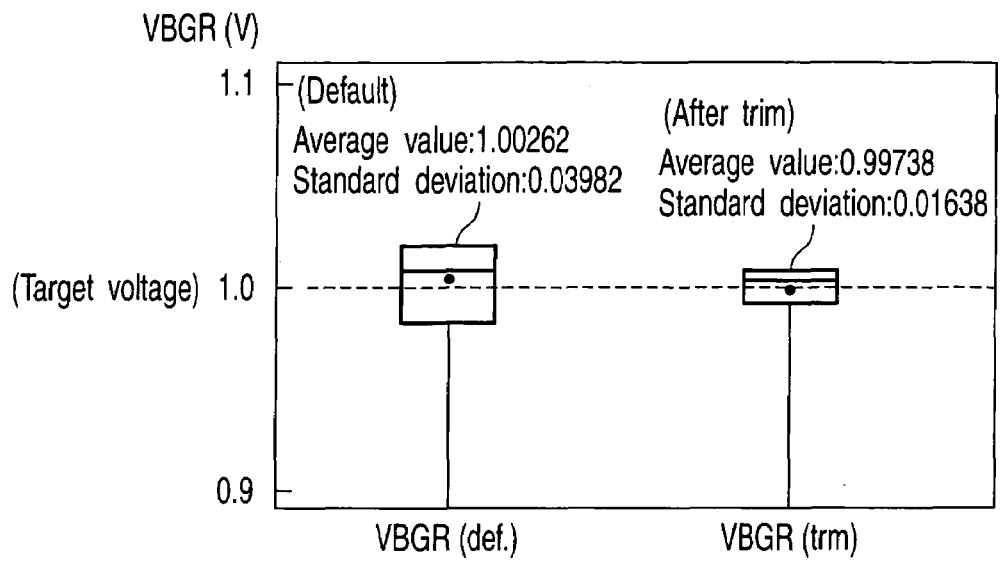
FIG. 8A is a diagram showing a variation in reference voltage VBGR and FIG. 8B is a diagram showing a variation in internal voltage VPPW.
Figure 8B:
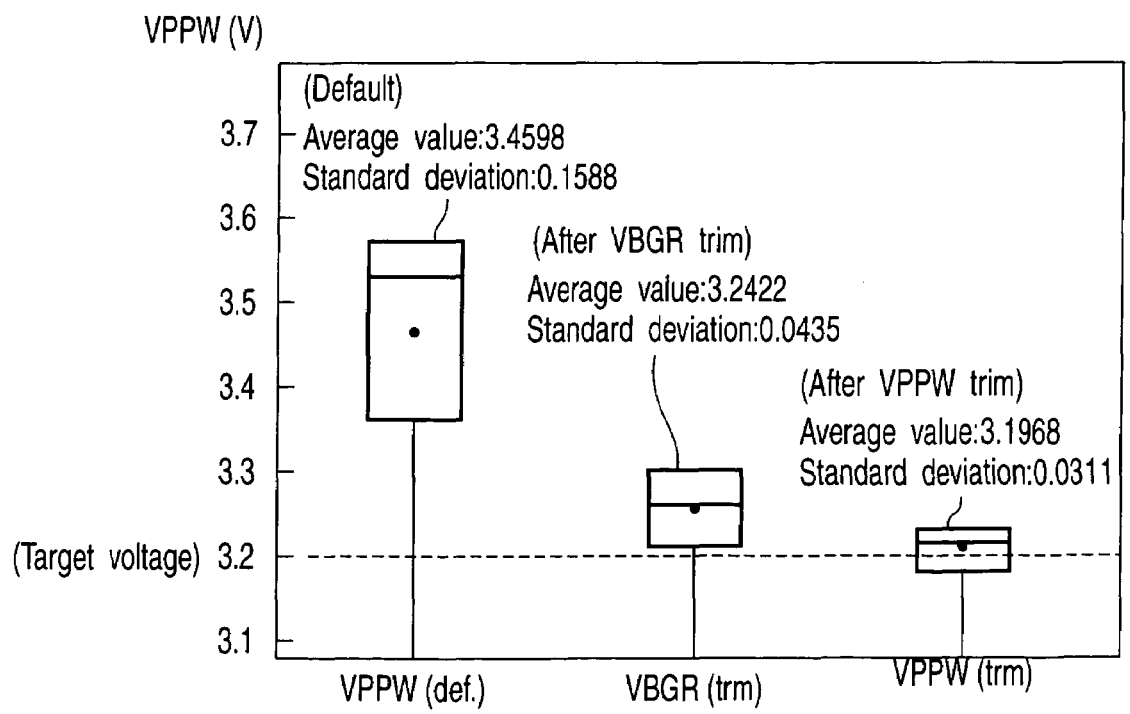

FIG. 8A shows a variation in reference voltage VBGR. FIG. 8B shows a variation in internal voltage VPPW. As is apparent from FIG. 8B, the amount of variation sharply decreases by means of trimming, compared to that observed by default. As shown in "after VBGR trimming" in FIG. 8B, the variation in internal voltage VPPW can be reduced by trimming the reference voltage VBGR, compared to that observed in the default state, in which trimming is not executed. Nevertheless, the variation in internal voltage VPPW and its deviation from the target voltage are not sufficiently reduced. However, as shown in "after VPPW trimming", the variation in internal voltage VPPW and its deviation from the target voltage can further be reduced by trimming the internal voltage, compared to those shown in "after VBGR trimming".

The first embodiment can thus reduce the variation in internal voltage to improve the reliability of the semiconductor device. Specifically, if the internal voltage is higher than the target voltage (set voltage), the increased stress of the transistors causes the transistors to last shorter. If the internal voltage is lower than the target voltage, the circuit operates slower. However, if the internal voltage can be set almost equal to the target voltage as in the first embodiment, the decrease in circuit operation speed can be suppressed to allow the transistors to last longer.

Second Embodiment

FIG. 9 shows a second embodiment, a variation of the second trimming circuit 14-1. In FIG. 9, the same components as those in FIG. 3 are denoted by the same reference numerals.

In FIG. 9, the voltage division circuit 14c has a resistor R0 and for example, two first resistors HR1 and HR2 and a plurality of second resistors LR1 to LRn connected together in series between the monitor pad MPD and the ground. The first resistors HR1 and HR2 have an equal resistance value. The second resistors LR1 to LRn have an equal resistance value. The resistance value of the first resistor HR1 or HR2 is set, for example, 10 times as large as that of one of the second resistors LR1 to LRn.

The switch circuit 14b is composed of first transistors 14h-1 and 14h-2 and second transistors 14l-1 to 14l-n, which are configured by N channel MOS transistors. The first transistor 14h-1 is connected in parallel with the first resistors HR1 and HR2. The first transistor 14h-2 is connected in parallel with the first resistor HR2. One end of each of the second transistors 14l-1 to 14l-n is connected to one end of the corresponding one of the second resistors LR1 to LRn. The other end of each of the second transistors 14l-1 to 14l-n is grounded.

A first decoder 14a-1 decodes, for example, upper 2 bits TDu of trimming data selected by the second selection circuit 22, shown in FIG. 1. A second decoder 14a-2 decodes, for example, lower n bits TDl of the trimming data. An output signal from the first decoder 14a-1 is supplied to the gates of the first transistors 14h-1 and 14h-2. An output signal from the second decoder 14a-2 is supplied to the gates of the second transistors 14l-1 to 14l-n.

In the above configuration, the second decoder 14a-2, second transistors 14l-1 to 14l-n, and second resistors LR1 to LRn finely adjust the internal voltage in accordance with the trimming data. The first decoder 14a-1, first transistors 14h-1 and 14h-2, and first resistors HR1 and HR2 roughly adjust the internal voltage in accordance with the trimming data.

According to the second embodiment, those of the first resistors HR1 and HR2 and second resistors LR1 to LRn which are to constitute the voltage division circuit 14c are selected by the first decoder 14a-1 and first transistors 14h-1 and 14h-2, which operate in accordance with the upper bits of the trimming data, and the second decoder 14a-2 and second transistors 14l-1 to 14l-n, which operate in accordance with the lower bits of the trimming data. Thus, the numbers of transistors, resistors, and control signals need not be equivalent to the amount of trimming. This in turn makes it possible to reduce the numbers of resistors and transistors and thus layout area.

Third Embodiment

Figure 10:
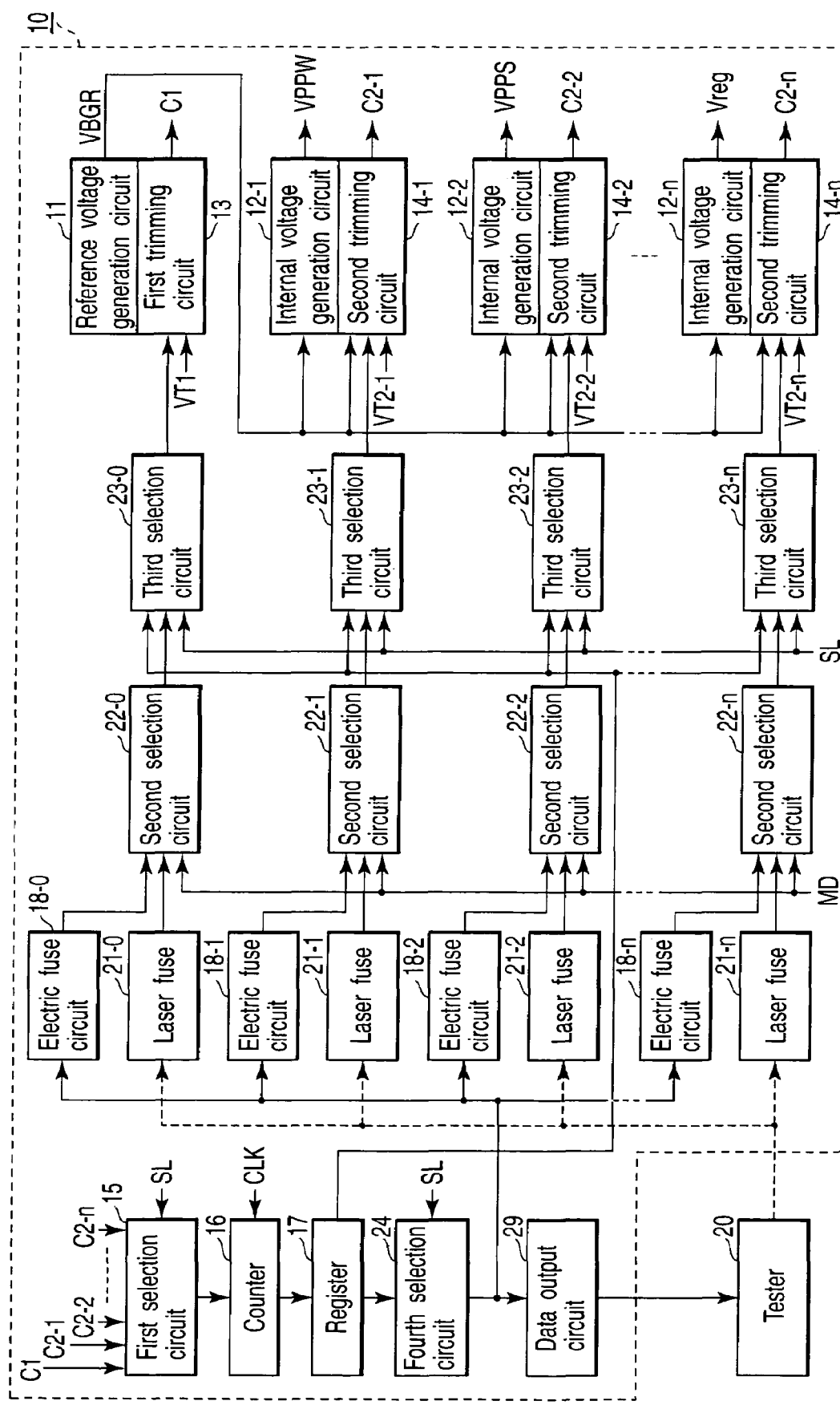
FIG. 10 is a diagram showing the configuration of a semiconductor device in accordance with a third embodiment.

FIG. 10 shows a third embodiment that is a variation of the configuration in FIG. 1. Unlike the circuit shown in FIG. 1, the circuit shown in FIG. 10 has a plurality of electric fuse circuits 18-0 to 18-n, a plurality of laser fuses 21-0 to 21-n, a plurality of second selection circuits 22-0 to 22-n, a plurality of third selection circuits 23-0 to 23-n, and a fourth selection circuit 24.

Specifically, the pairs of the electric fuse circuits 18-0 to 18-n and laser fuses 21-0 to 21-n are individually arranged in association with the reference voltage generation circuit 11 and internal voltage generation circuits 12-1 to 12-n, respectively. Specifically, the electric fuse circuit 18-0 and laser fuse 21-0 are arranged in association with the reference voltage generation circuit 11. The electric fuse circuit 18-1 and laser fuse 21-1 are arranged in association with the internal voltage generation circuit 12-1. The electric fuse circuit 18-n and laser fuse 21-n are arranged in association with the internal voltage generation circuit 12-n.

The second selection circuit 22-0 is placed in association with the reference voltage generation circuit 11. The second selection circuit 22-0 selects the electric fuse circuit 18-0 or the laser fuse 21-0 in accordance with the mode signal MD. The second selection circuit 22-1 is placed in association with the internal voltage generation circuit 12-1. The second selection circuit 22-1 selects the electric fuse circuit 18-1 or the laser fuse 21-1 in accordance with the mode signal MD. The second selection circuit 22-n is placed in association with the internal voltage generation circuit 12-n. The second selection circuit 22-n selects the electric fuse circuit 18-n or the laser fuse 21-n in accordance with the mode signal MD.

The third selection circuit 23-0 is placed in association with the reference voltage generation circuit 11. The third selection circuit 23-0 selects an output signal from the second selection circuit 22-0 or an output signal from the register 17 in accordance with the selection signal SL. The selected signal is supplied to the first trimming circuit 13. The third selection circuit 23-1 is placed in association with the internal voltage generation circuit 12-1. The third selection circuit 23-1 selects an output signal from the second selection circuit 22-1 or an output signal from the register 17 in accordance with the selection signal SL. The selected signal is supplied to the second trimming circuit 14-1. The third selection circuit 23-n selects an output signal from the second selection circuit 22-n or an output signal from the register 17 in accordance with the selection signal SL. The selected signal is supplied to the second trimming circuit 14-n.

The counter 16 and register 17 are shared by the reference voltage generation circuit 11 and internal voltage generation circuits 12-1 to 12-n. A fourth selection circuit 24 is provided at out output end of the register 17. The fourth selection circuit 24 supplies the reference voltage held in the register 17 and the trimming data for the internal voltages to the electric fuse circuits 18-0 to 18-n or data output circuit 19.

The trimming data stored in the tester 20 is set for the laser fuses 21-0 to 21-n.

The third embodiment can produce effects similar to those of the first and second embodiments.

FIG. 11 shows an example of application of the first to third embodiments. FIG. 11 shows a memory card 41 in which a NAND type flash memory 40 is mounted as an example of the semiconductor device 10. The memory card 41 is connected to, for example, a digital still camera 42. The digital still camera 42 has a controller 43 serving as a host system. The NAND type flash memory 40 has a memory array composed of a plurality of EEPROM cells connected together in series. The NAND type flash memory 40 operates in accordance with commands and address signals output by the controller 43. The host-side instrument is not limited to the digital still camera. Various electronic instruments, for example, cellular phones and memory card readers/writers are applicable. The controller may be built into the memory card 40. In this example, the controller 43 in the memory card 41 functions as a host system.

The NAND type flash memory 40 has a control voltage generation circuit 44 that includes, for example, the circuits shown in the first to third embodiments. Specifically, the control voltage generation circuit 44 includes the reference voltage generation circuit 11, first trimming circuit 13, internal voltage generation circuits 12-1 to 12-n, second trimming circuits 14-1 to 14-n, and others. FIG. 11 shows only some of these circuits. The various internal voltages trimmed by the second trimming circuits 13 and 14-1 to 14-n are supplied to the NAND type flash memory 40. The NAND type flash memory 40 performs a data write, read, and erase operations in accordance with these internal voltages. This enables the data write, read, and erase operations to be precisely performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor device comprising:
 a reference voltage generation circuit which generates a reference voltage;

an internal voltage generation circuit which generates an internal voltage on the basis of the reference voltage generated by the reference voltage generation circuit; and a first trimming circuit which trims the internal voltage, the first trimming circuit, during trimming of the internal voltage, trimming an externally supplied first target voltage in accordance with first trimming data, and ending the trimming when the first target voltage meets a given condition for the reference voltage.

2. The device according to claim 1, further comprising:

a counter which counts clock signals, the counter stopping counting the clock signals in accordance with to a first signal output by the first trimming circuit and indicating end of trimming; and a storage circuit which stores a count value from the counter as the first trimming data.

3. The device according to claim 1, wherein the first trimming circuit comprises:

a first voltage division circuit which divides an internal voltage generated by the internal voltage generation circuit during a normal operation and which divides the first target voltage during trimming;

a first level change circuit which changes a voltage division ratio for the first voltage division circuit in accordance with the first trimming data; and a first comparator which compares an output voltage from the first voltage division circuit with the reference voltage, the first comparator outputting the first signal when the output voltage from the first voltage division circuit and the reference voltage meet a given condition.

4. The device according to claim 2, further comprising:

a second trimming circuit which trims the reference voltage generated by the reference voltage generation circuit, wherein the second trimming circuit comprises:

a second voltage division circuit which divides the reference voltage generated by the reference voltage generation circuit;

a second level change circuit which changes a voltage division ratio for the second voltage division circuit in accordance with second trimming data supplied by the storage circuit; and a second comparator which compares a voltage resulting from the division by the second voltage diving circuit with the second target voltage, the second comparator outputting a second signal which stops the counter when the voltage resulting from the division by the second voltage diving circuit and the second target voltage meet a given condition.

5. The device according to claim 4, wherein the storage circuit stores the count value from the counter as the second trimming data during trimming of the reference voltage.

6. The device according to claim 4, further comprising a selection circuit connected to the storage circuit, the selection circuit supplying the first trimming circuit with the first trimming data stored in the storage circuit and supplying the second trimming data to the second trimming circuit.

7. The device according to claim 6, wherein the storage circuit comprises at least one of a register, a fuse element, an EEPROM cell, and a laser fuse.

8. The device according to claim 3, wherein the first level change circuit comprises:

a first change circuit which changes the voltage division ratio for the first voltage division circuit in accordance with upper bits of the first trimming data; and a second change circuit which changes the voltage division ratio for the first voltage division circuit in accordance with lower bits of the first trimming data.

9. The device according to claim 8, wherein the first voltage division circuit comprises:

a first resistance which is changed by the first change circuit; and a second resistance which is changed by the second change circuit and which has a smaller resistance value than the first resistance.

10. A semiconductor device comprising:

a reference voltage generation circuit which generates a reference voltage;

a first trimming circuit which trims the reference voltage generated by the reference voltage generation circuit, the first trimming circuit, during trimming of the reference voltage, ending the trimming when the reference voltage meets a given condition for an externally supplied first target voltage on the basis of first trimming data;

an internal voltage generation circuit which generates an internal voltage on the basis of the reference voltage trimmed by the first trimming circuit; and a second trimming circuit which trims the internal voltage, the second trimming circuit, during trimming of the internal trimming, ending the trimming when an externally supplied second target voltage meets a given condition for the reference voltage on the basis of second trimming data.

11. The device according to claim 10, further comprising:

a counter which counts clock signals, the counter, during trimming of the reference voltage, stopping counting the clock signals in accordance with a first signal output by the first trimming circuit and indicating end of trimming, and during trimming of the internal voltage, stopping counting the clock signals in accordance with a second signal output by the second trimming circuit and indicating end of trimming; and a storage circuit which, during trimming of the reference voltage, stores a count value from the counter as the first trimming data, the storage circuit storing, during trimming of the internal voltage, the count value from the counter as the second trimming data.

12. The device according to claim 11, further comprising an output circuit outputting the count value of the counter to an external.

13. The device according to claim 10, wherein the first trimming circuit comprises:

a first voltage division circuit which divides the reference voltage generated by the reference voltage generation circuit;

a first level change circuit which, during trimming of the reference voltage, changes a voltage division ratio for the first voltage division circuit in accordance with first trimming data supplied by the storage circuit; and a first comparator which, during trimming of the reference voltage, compares a voltage resulting from the division by the first voltage division circuit with the first target voltage, the first comparator outputting the first signal when the voltage resulting from the division by the first voltage division circuit and the first target voltage meet a given condition.

14. The device according to claim 10, wherein the second trimming circuit comprises:

a second voltage division circuit which, during a normal operation, divides the internal voltage generated by the internal voltage generation circuit and which, during trimming, divides the second target voltage;

a second level change circuit which changes a voltage division ratio for the second voltage division circuit in accordance with the second trimming data; and a second comparator which compares an output voltage from the second voltage division circuit with the reference voltage, the second comparator outputting the second signal when the output voltage from the second voltage division circuit and the reference voltage meet a given condition.

15. The device according to claim 11, wherein the storage circuit comprises at least one of a register, a fuse element, an EEPROM cell, and a laser fuse.

16. The device according to claim 14, wherein the second level change circuit comprises:

a first change circuit which changes the voltage division ratio for the second voltage division circuit in accordance with upper bits of the second trimming data; and a second change circuit which changes the voltage division ratio for the second voltage division circuit in accordance with lower bits of the second trimming data.

17. The device according to claim 16, wherein the second voltage division circuit comprises:

a first resistance which is changed by the first change circuit; and a second resistance which is changed by the second change circuit and which has a smaller resistance value than the first resistance.

18. A memory system comprising:

a memory cell array in which a plurality of nonvolatile memory cells are arranged; and a control voltage generation circuit connected to the memory cell array, the control voltage generation circuit comprising:

a reference voltage generation circuit which generates a reference voltage;

an internal voltage generation circuit which generates an internal voltage on the basis of the reference voltage generated by the reference voltage generation circuit; and a first trimming circuit which trims the internal voltage, the first trimming circuit, during trimming of the internal voltage, trimming an externally supplied first target voltage in accordance with first trimming data, and ending the trimming when the first target voltage meets a given condition for the reference voltage.

19. The memory system according to claim 18, further comprising:

a second trimming circuit which trims the reference voltage, the second trimming circuit, during trimming of the reference voltage, ending the trimming in accordance with second trimming data when the reference voltage meets a given condition for a second target voltage.

20. The memory system according to claim 19, further comprising:

a counter which counts clock signals, the counter, during trimming of the internal voltage, stopping counting the clock signals in accordance with a first signal output by the first trimming circuit and indicating end of trimming, and during trimming of the reference voltage, stopping counting the clock signals in accordance with a second signal output by the second trimming circuit and indicating end of trimming; and a storage circuit which, during trimming of the internal voltage, stores a count value from the counter as the first trimming data, the storage circuit storing, during trimming of the reference voltage, the count value from the counter as the second trimming data.

* * * * *